(12) United States Patent
Khoury et al.

(10) Patent No.: US 10,116,074 B1
(45) Date of Patent: Oct. 30, 2018

(54) GRADED MIDPLANE

(71) Applicant: Mellanox Technologies, Ltd., Yokneam (IL)

(72) Inventors: Samer Khoury, Nazareth Illit (IL); Avi Gibbs, Rehovot (IL); Igor Loiferman, Yokneam Illit (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 15/582,705

(22) Filed: Apr. 30, 2017

(51) Int. Cl.
*H01R 12/72* (2011.01)
*H01R 13/73* (2006.01)
*H05K 1/18* (2006.01)
*H05K 7/14* (2006.01)

(52) U.S. Cl.
CPC ........... *H01R 12/724* (2013.01); *H01R 13/73* (2013.01); *H05K 1/181* (2013.01); *H05K 7/1422* (2013.01); *H05K 7/1451* (2013.01); *H05K 2201/1031* (2013.01)

(58) Field of Classification Search
CPC ....... H01R 12/724; H01R 13/73; H05K 1/181
USPC ........................................................ 439/78
See application file for complete search history.

(56) References Cited

U.S. PATENT DOCUMENTS

| | | |
|---|---|---|
| 3,855,427 A | 12/1974 | Sinden |
| 4,732,446 A | 3/1988 | Gipson et al. |
| 5,054,870 A | 10/1991 | Losch et al. |
| 5,184,961 A * | 2/1993 | Ramirez .............. H01R 13/518 439/248 |
| 5,199,087 A | 3/1993 | Frazier |
| 5,475,778 A | 12/1995 | Webb |
| 5,535,036 A | 7/1996 | Grant |
| 5,692,910 A * | 12/1997 | Mittal .................... H05K 1/117 439/59 |
| 6,215,654 B1 | 4/2001 | Wilkie, II et al. |
| 6,267,628 B1 | 7/2001 | Meckley et al. |
| 6,343,171 B1 | 1/2002 | Yoshimura et al. |
| 6,385,361 B1 | 5/2002 | Corr |
| 6,393,183 B1 * | 5/2002 | Worley ................. G02B 6/122 257/81 |
| 6,399,964 B1 | 6/2002 | Corr |
| 6,504,841 B1 | 1/2003 | Larson et al. |
| 6,512,861 B2 | 1/2003 | Charkavorty et al. |
| 6,574,687 B1 * | 6/2003 | Teachout ............. G06F 3/0614 710/38 |
| 6,611,635 B1 | 8/2003 | Yoshimura et al. |
| 6,684,007 B2 | 1/2004 | Yoshimura et al. |
| 6,690,845 B1 | 2/2004 | Yoshimura et al. |

(Continued)

OTHER PUBLICATIONS

Custom Interconnects LLC, "Fuzz Buttons", 2 pages, Oct. 18, 2016.

(Continued)

*Primary Examiner* — Alexander Gilman
(74) *Attorney, Agent, or Firm* — D. Kligler IP Services Ltd.

(57) ABSTRACT

An electronic module includes, a circuit board having front and rear edges, and first and second connectors. The rear edge includes, (i) a first section at a first distance from the front edge, and (ii) a second section at a second distance from the front edge, different from the first distance. The first and second connectors are mounted along the rear edge at the first and second sections, respectively, and are configured to connect the circuit board to an interconnect unit.

15 Claims, 5 Drawing Sheets

(56) References Cited

U.S. PATENT DOCUMENTS

| | | | |
|---|---|---|---|
| 6,706,546 B2 | 3/2004 | Yoshimura et al. | |
| 6,713,755 B1 | 3/2004 | Iwasa | |
| 6,821,029 B1 | 11/2004 | Grung et al. | |
| 6,845,184 B1 | 1/2005 | Yoshimura et al. | |
| 6,945,712 B1 | 9/2005 | Conn | |
| 7,200,295 B2 | 4/2007 | Rolston et al. | |
| 7,362,941 B2 | 4/2008 | Rinderer et al. | |
| 7,435,097 B2 | 10/2008 | Mecker | |
| 7,510,421 B2 | 3/2009 | Fransen et al. | |
| 7,539,376 B2 | 5/2009 | Bozso et al. | |
| 7,698,491 B1* | 4/2010 | King, Jr. | G06F 13/409 174/50 |
| 7,706,361 B2* | 4/2010 | McMillen | G01J 3/06 370/386 |
| 7,729,581 B2 | 6/2010 | Rolston et al. | |
| 7,974,105 B2 | 7/2011 | Dean, Jr. et al. | |
| 7,983,194 B1* | 7/2011 | Genetti | H04L 49/1523 370/254 |
| 3,060,682 A1 | 11/2011 | Genetti et al. | |
| 3,068,351 A1 | 11/2011 | Figueroa et al. | |
| 8,060,682 B1* | 11/2011 | Genetti | G06F 13/4022 370/400 |
| 8,259,450 B2* | 9/2012 | Dunwoody | H05K 7/1488 165/104.33 |
| 8,270,830 B2* | 9/2012 | Kirkpatrick | H04Q 11/0005 385/17 |
| 8,371,860 B2* | 2/2013 | Xiang | H01R 13/193 439/60 |
| 8,410,364 B2* | 4/2013 | Dunwoody | H05K 7/1491 174/68.1 |
| 8,411,465 B2 | 4/2013 | Dean, Jr. et al. | |
| 8,441,793 B2* | 5/2013 | Dunwoody | H05K 7/20781 165/104.26 |
| 8,452,140 B2 | 5/2013 | Yeh et al. | |
| 8,588,561 B2 | 11/2013 | Zbinden et al. | |
| 8,588,562 B2 | 11/2013 | Zbinden et al. | |
| 8,749,986 B1* | 6/2014 | Peterson | H05K 1/117 174/254 |
| 8,787,711 B2 | 7/2014 | Zbinden et al. | |
| 8,905,632 B2 | 12/2014 | Shastri et al. | |
| 9,002,155 B2 | 4/2015 | Li et al. | |
| 9,031,107 B2 | 5/2015 | Shastri et al. | |
| 9,118,144 B2 | 8/2015 | Hasse et al. | |
| 9,166,312 B2 | 10/2015 | Bakatsias et al. | |
| 9,374,165 B2 | 6/2016 | Zbinden et al. | |
| 9,423,578 B2 | 8/2016 | Lai et al. | |
| 9,531,645 B2 | 12/2016 | Loiferman et al. | |
| 9,554,461 B2* | 1/2017 | Kato | H04M 1/026 |
| 9,584,373 B2* | 2/2017 | Schlansker | H04L 49/65 |
| 9,697,160 B2* | 7/2017 | Genetti | G02B 6/2804 |
| 2002/0018339 A1 | 2/2002 | Uzuka et al. | |
| 2002/0191649 A1 | 12/2002 | Woodring | |
| 2005/0191003 A1 | 9/2005 | Yorks et al. | |
| 2007/0294520 A1 | 12/2007 | Leigh et al. | |
| 2008/0062655 A1 | 3/2008 | Laursen et al. | |
| 2008/0222351 A1 | 9/2008 | Verdiell et al. | |
| 2010/0254652 A1* | 10/2010 | Kirkpatrick | H04Q 11/0005 385/17 |
| 2013/0028256 A1 | 1/2013 | Koren et al. | |
| 2014/0056174 A1 | 2/2014 | Walden et al. | |
| 2014/0259650 A1 | 9/2014 | Carter et al. | |
| 2015/0351233 A1* | 12/2015 | Peterson | H05K 1/0278 361/785 |
| 2016/0036727 A1* | 2/2016 | Loiferman | H04L 49/25 370/401 |
| 2017/0063730 A1 | 3/2017 | Loiferman et al. | |

OTHER PUBLICATIONS

Amphenol TCS, "TB-2324—General Product Specification for Paladin TM Interconnect Systems", Revision "F", 11 pages, 2017.
Badihi et al., U.S. Appl. No. 15/494,578, filed Apr. 24, 2017.
U.S. Appl. No. 15/350,127 office action dated Aug. 11, 2017.
U.S. Appl. No. 15/350,127 office action dated Mar. 9, 2018.

* cited by examiner

GRADED MIDPLANE

FIELD OF THE INVENTION

The present invention relates generally to communication equipment, and particularly to methods and systems for signal interconnection in communication systems.

BACKGROUND OF THE INVENTION

Electrical connector assemblies used within elements of communication systems, such as a midplane of a network switch, are designed with various connectivity schemes.

For example, U.S. Pat. No. 6,267,628, whose disclosure is incorporated herein by reference, describes a high frequency, modular electrical connector assembly that includes contact/terminal members arranged to reduce crosstalk during use. The connector assembly includes a dielectric housing having a receptacle and an insert assembly arranged therein.

U.S. Pat. No. 9,118,144, whose disclosure is incorporated herein by reference, describes an electrical connector for connecting bus lines to a card such as a memory card or media card, including a multi-level connector comprising a latching device having a plurality of insertable latch positions that advantageously allows for selectively connecting or isolating an electrical path to an adjoining connector.

U.S. Pat. No. 9,166,312, whose disclosure is incorporated herein by reference, describes a printed circuit board (PCB) assembly for use with first and second cables terminated with first and second cable lugs, respectively, each of the first and second cable lugs includes two lug holes defined therein, the includes a PCB and a terminal block.

SUMMARY OF THE INVENTION

An embodiment of the present invention that is described herein provides an electronic module that includes, a circuit board having front and rear edges, and first and second connectors. The rear edge includes, (i) a first section at a first distance from the front edge, and (ii) a second section at a second distance from the front edge, different from the first distance. The first and second connectors are mounted along the rear edge at the first and second sections, respectively, and are configured to connect the circuit board to an interconnect unit.

In some embodiments, the circuit board has an Integrated Circuit (IC) mounted thereon, and includes circuit traces that connect the IC to the first and second connectors. In other embodiments, the IC is equidistant from the first and second connectors.

In an embodiment, the rear edge includes a third section located at the second distance from the front edge. In another embodiment, the front edge includes a flat section.

There is additionally provided, in accordance with an embodiment of the present invention, an electronic rack that includes, a first interconnect unit and a second interconnect unit that includes, a first section at a first distance from the first interconnect unit and a second section at a second distance from the first interconnect unit, different from the first distance, and first and second connectors, which are mounted along the second interconnect unit at the first and second sections, respectively, and are configured to connect the second interconnect unit to one or more electronic modules inserted into the second interconnect unit.

There is additionally provided, in accordance with an embodiment of the present invention, a method for producing an electronic module, the method includes, providing a circuit board having front and rear edges, the rear edge includes, (i) a first section at a first distance from the front edge and (ii) a second section at a second distance from the front edge, different from the first distance. First and second connectors are attached to the circuit board along the rear edge at the first and second sections, respectively.

There is further provided, in accordance with an embodiment of the present invention, an electronic module that includes, a circuit board having front and rear edges, first and second connectors, and an integrated circuit (IC). The rear edge includes, (i) a first section at a first distance from the front edge and (ii) a second section at a second distance from the front edge, different from the first distance. The first and second connectors are mounted along the rear edge of the circuit board at the first and second sections, respectively, and are configured to connect the circuit board to an interconnect unit. The IC is mounted on the circuit board and its center is positioned at a first distance from the first connector and at a second distance from the second connector, such that a sum of the first and second distances is minimal among all possible positions of the IC on the circuit board.

The present invention will be more fully understood from the following detailed description of the embodiments thereof, taken together with the drawings in which:

DETAILED DESCRIPTION OF EMBODIMENTS

Overview

Network switches, such as director-class switches, are used, for example, in data centers that support high data rates on an order of GigaBits per second (GBPS) or even TeraBits per second (TBPS).

Embodiments of the present invention that are described hereinbelow provide improved techniques for transferring electrical signals in a midplane, which connects between frontplane and backplane modules of a director-class switch. In some embodiments, the midplane comprises cables, connectors and interconnect units (such as a spine plate and a leaf plate), which connect between electronic boards such as spine and leaf switches. For example, electrical signals are typically routed from a leaf switch to a spine switch via the leaf plate, a cable and the spine plate. Each leaf switch and spine switch typically comprises one or more Integrated Circuit (IC) devices, and circuit traces that connect the IC to the respective interconnect unit, via the connectors.

In practice, the high data rate of the signals (e.g., TBPS) makes the signals prone to poor signal integrity and high attenuation loss. In particular, the inventors have found that the signal loss (per unit length) in cables is five or six times smaller than in circuit traces.

In some embodiments that are described herein, signal loss is reduced by having the spine plate (and the rear edge of the spine switches that plug into the spine plate) have a graded shape comprising at least two sections located at different distances from a front edge of the spine switch. In an embodiment, the IC is mounted at a minimal distance from the connectors of the spine switch and spine plate. This configuration enables routing the signals via a minimal, and optionally uniform, length of circuit traces from the IC mounted on the spine switch to the connectors, and routing a longer portion of the path length over cable, thus reducing the signal loss. Moreover, the graded structure enables fitting the spine switch snugly into a respective slot of the spine plate.

The disclosed techniques provide improved data integrity and lower signal loss in high-bandwidth (e.g., GBPS and TBPS) communication systems, and are particularly important in data centers using Ethernet and Infiniband director-class switches.

System Description

Figure 1:
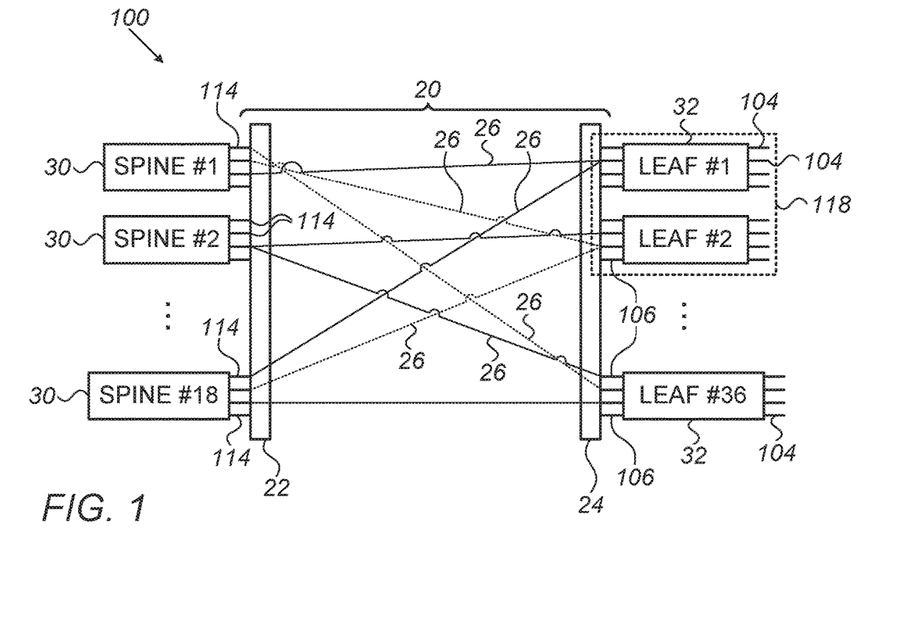
FIG. 1 is a block diagram that schematically illustrates a director-class switch, in accordance with an embodiment of the present invention.

FIG. 1 is a block diagram of a director-class switch 100, in accordance with an embodiment of the present invention. Director-class switch 100 comprises multiple leaf switches 32 (each referred to simply as a "leaf" for brevity). Each leaf 32 connects multiple external ports 104 to one another and to one or more internal ports 106. External ports 104 are configured to connect to external devices (not shown), such as servers, computers, other switches or storage units. In an embodiment, a single leaf 32 or multiple leaves 32 may be mounted on a respective leaf board 118. In the example of FIG. 1, leaf board 118 comprising leaves 32 is inserted into an interconnect unit referred to as a leaf plate 24. In some cases, a pair of leaves 32 may be mounted on a single leaf board 118.

Switch 100 further comprises multiple spine switches 30 (each referred to simply as a "spine" for brevity). Each spine 30 comprises a respective spine switch (not shown) which connects multiple spine ports 114 to one another. In some embodiments, spines 30 are inserted into an interconnect unit referred to as a spine plate 22. Spine 30 and spine plate 22 are depicted in detail in FIGS. 2-5 below.

In some embodiments, switch 100 comprises a midplane 20, which comprises multiple cables 26, made from copper or any other suitable material. Alternatively the cables may comprise optical fibers. In some embodiments, cables 26 connect between spines 30 and leaves 32, which are inserted into spine plate 22 and leaf plate 24, respectively.

Further details on the architecture of switch 100, including cables 26, spines 30, leaves 32 and their ports are described in U.S. Pat. No. 9,531,645, whose disclosure is incorporated herein by reference.

Figure 2:
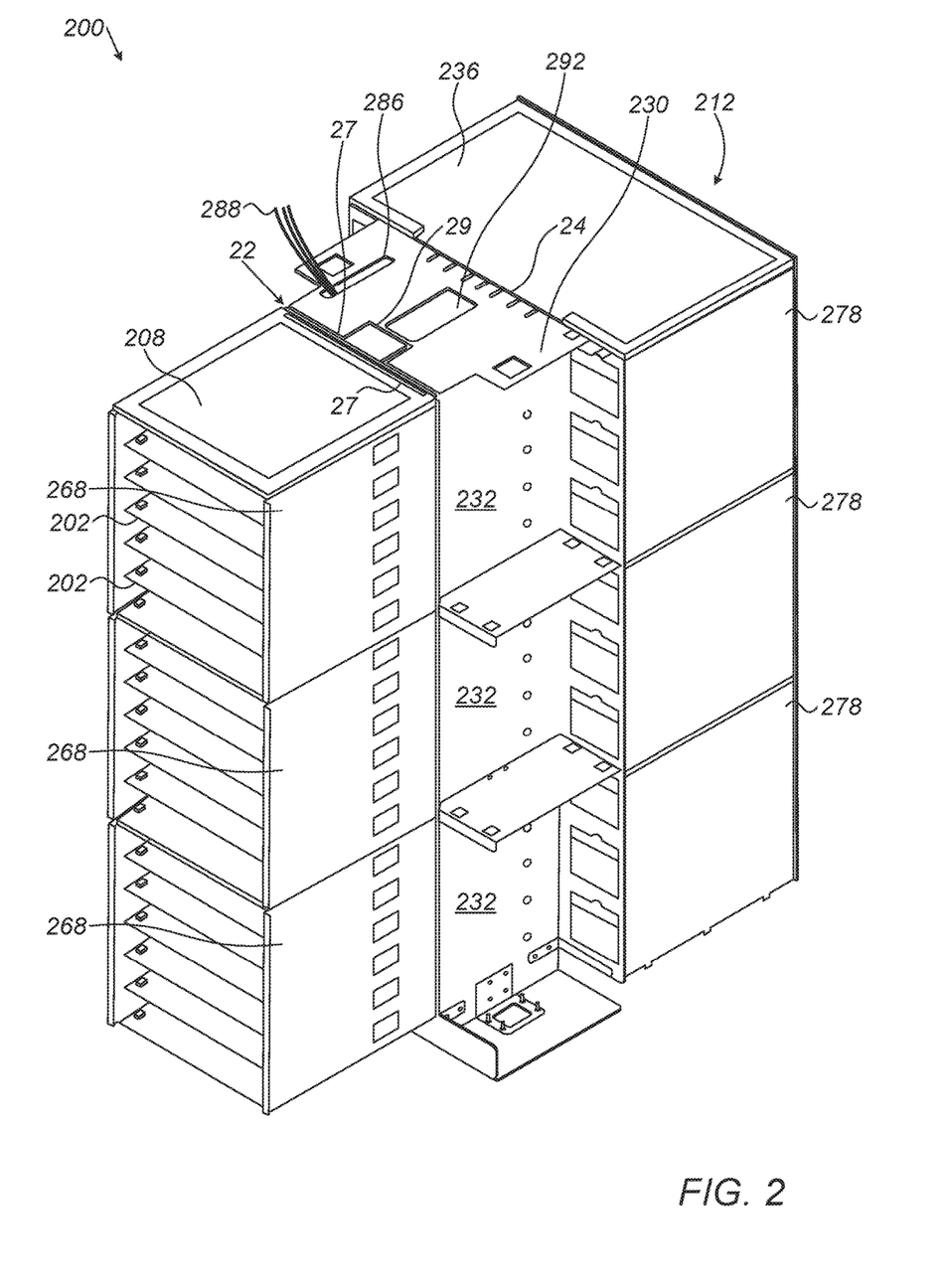
FIG. 2 is a schematic, pictorial illustration of a director-class switch, in accordance with an embodiment of the present invention.

FIG. 2 is a schematic, pictorial illustration of a main unit chassis 200 of director-class switch 100 (FIG. 1), in accordance with an embodiment of the present invention. In some embodiments, main unit chassis 200 comprises multiple electronic racks or fixtures containing multiple shelves, such as a midplane cage 230, a spine basket unit 208 and a leaf basket unit 236. Spine basket unit 208 comprises multiple spine slots 202 for receiving spines 30 (shown in FIG. 1). Leaf basket unit 236 comprises multiple leaf slots 212 for receiving leaves 32 (not shown in this figure). In some embodiments, spine basket unit 208 comprises multiple sub units 268, which are separately attached to midplane cage 230. Alternatively or additionally, leaf basket unit 236 comprises multiple sub units 278, which are separately attached to midplane cage 230.

In some embodiments, midplane cage 230 comprises spine plate 22, leaf plate 24, cables 26 (shown in FIG. 1) connecting therebetween, and optionally frame plates 232 used for housing midplane 20 shown in FIG. 1.

In some embodiments, power cables 288 enter midplane cage 230 through a power slot 286. In an embodiment, a top opening 292 of midplane cage 230 is used for passing control wires (not shown) to the leaf and/or spine boards.

In some embodiments, spine plate 22 has a graded shape comprising three sections: two sections 27 and a single section 29. Spine plate 22 is depicted in detail in FIG. 3 below. As will be shown further below, each spine 30 has a similarly graded shape comprising three sections, which plug into the corresponding sections of spine plate 22.

In the context of the present patent application and in the claims, the term "graded" refers to an edge (of a plate such as spine plate 22, or an electronic module such as spine 30), which comprises two or more sections, each section located at a different distance from a common plane, such as leaf plate 24. For example, section 29 of spine plate protrudes into the midplane so that the distance between section 29 and leaf plate 24 is smaller than the distance between sections 27 and plate 24.

Improved Connectivity Using a Graded Midplane

Figure 3:
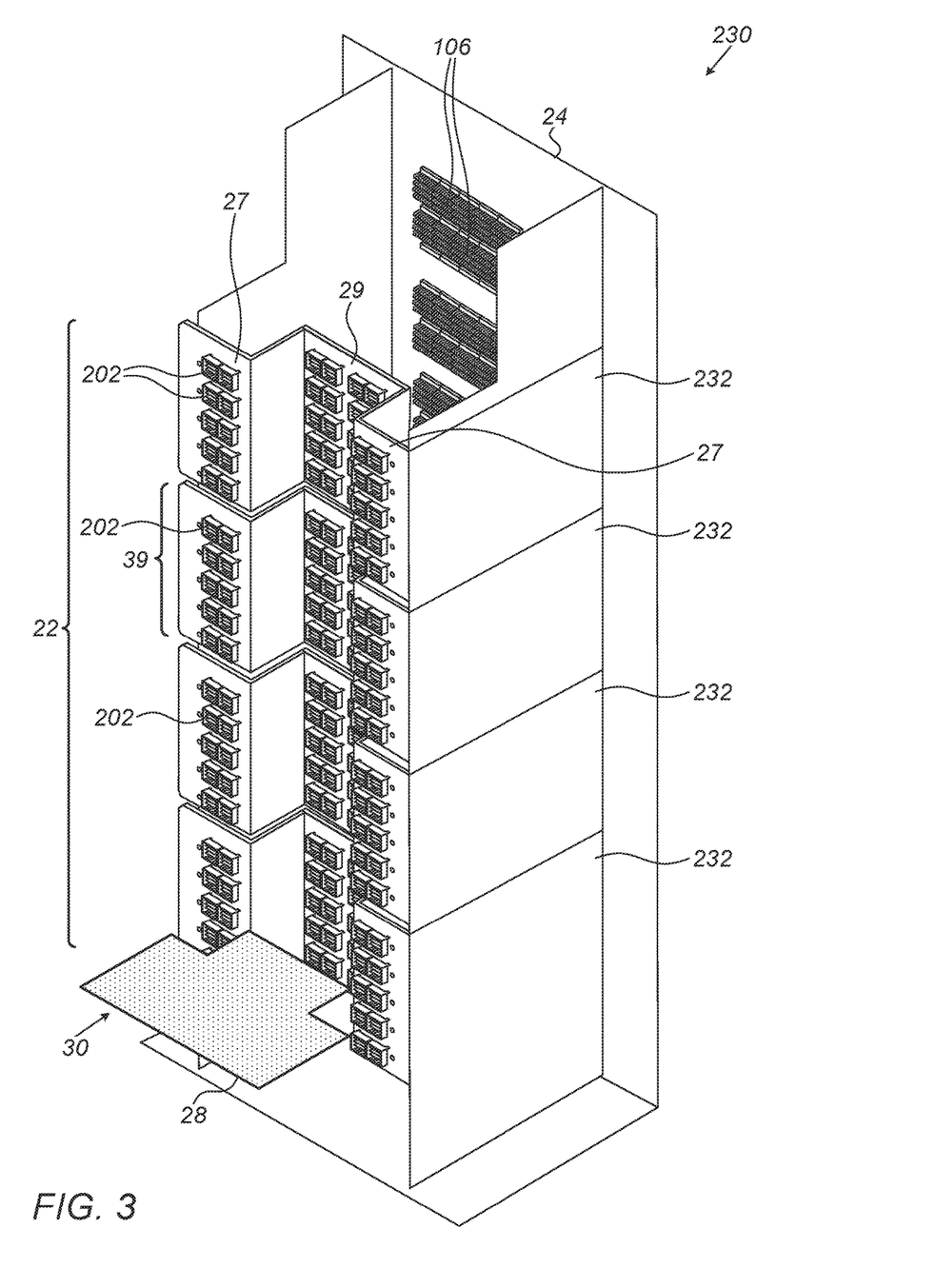
FIG. 3 is a schematic, pictorial illustration of a midplane cage used in a director-class switch, in accordance with an embodiment of the present invention.

FIG. 3 is a schematic, pictorial illustration of midplane cage 230, in accordance with an embodiment of the present invention. In some embodiments, spine plate 22 comprises multiple spine ports 202 mounted on frame plates 232, stacked vertically relative to one another, or in any other suitable configuration.

In some embodiments, spine plate 22 comprises multiple sub-plates 39 attached between frame plates 232 and sub units 268 shown in FIG. 1. In alternative embodiments, spine plate 22 is made from a single unit.

In the example of FIG. 3, spine plate 22 comprises four sub-plates 39, whereas the upper fifth sub-plate and cables 26 are absent from the drawing for the sake of clarity, so as to show leaf plate 24, internal ports 106 and the shape of spine plate 22.

In an embodiment, spine plate 22 has a graded shape, in which sections 29 and 27 are located at different distances relative to leaf plate 24. In the example of FIG. 3, section 29 protrudes toward plate 24, and is thus closer to leaf plate 24 than sections 27. In the example of FIG. 3, each spine 30 is inserted into a respective spine port 202 and is connected to spine plate 22 using connectors (shown in FIGS. 4 and 5).

In some embodiments, spine 30 has a flat front edge 28 and a graded rear edge, which is compatible to the graded shape of spine plate 22. During insertion, spine 30 fits snugly into the graded shape of spine plate 22. The rear edge of spine 30 comprises multiple sections, such as three sections, as shown in detail in FIGS. 4 and 5 below.

In alternative embodiments, front edge 28 may comprise multiple sections, arranged in a flat configuration or in a graded configuration.

Figure 4:
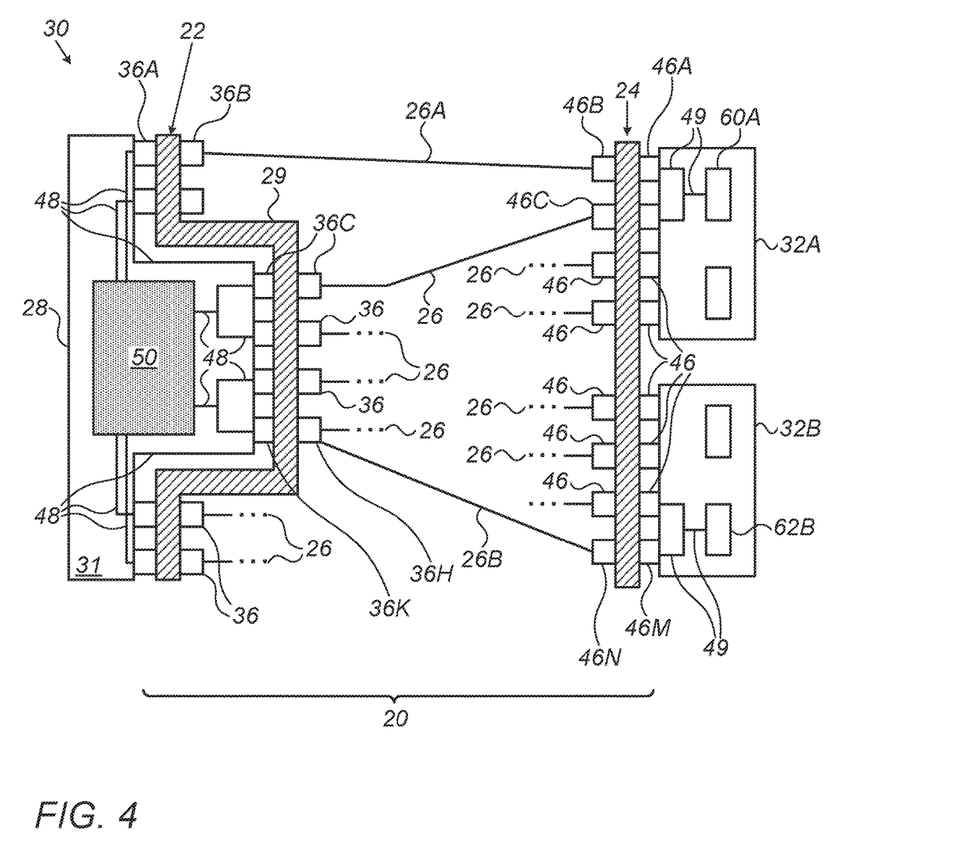
FIG. 4 is a schematic, top view of a midplane of a director-class switch, in accordance with an embodiment of the present invention.

FIG. 4 is a schematic, top view of midplane 20, in accordance with an embodiment of the present invention. In the present example, two leaves 32 are connected to leaf plate 24 via circuit traces 49 and connectors 46 located at the right and left sides of leaf plate 32. The connectors on the right side, such as 46A and 46M, may serve for example, as internal ports 106 of FIG. 1 above and are used for connecting leaf 32 to leaf plate 24 electrically and mechanically. The connectors on the left side, such as connectors 46B and 46N, are used for connecting leaf plate 24 to cables 26. In an embodiment, a leaf 32A comprises an Integrated Circuit (IC) 60A, and a leaf 32B comprises an IC 62A.

In some embodiments, connectors 36 are located on the right and left sides of spine plate 22. The connectors on the right side, such as connectors 36B and 36H, connect between spine plate 22 and cables 26, and the connectors on the left side, such as 36A and 36K, connect spine plate 22 with spine 30. Each pair of connectors (e.g., 36A-36B, or 46A-46B) represents a single port.

For the sake of clarity, the terms "connector" and "sub-connector" in the present invention are used interchangeably. For example, a sub-connector or connector 36A is configured to connect between spine plate 22 and spine 50 (via traces 48), and sub-connector or connector 36B is configured to connect between spine plate 22 and a sub-connector or connector 46B of leaf plate 24 (via a cable 26A).

In some embodiments, all the connectors in switch 100 (e.g., 36, 46) may be general off-the-shelf connectors, such as Paladin™ 4 pair×10 Column connectors (part number C-JP400-50005) produced by Amphenol TCS (Nashua, N.H.), or any other suitable type of connector, which is configured to connect any suitable number of pairs (e.g., between 1 and 8 pairs) of interconnections. In other embodiments, the connectors attached to spine 30 and leaf 32 may be off-the-shelf connectors, and the connectors of spine plate 22 and/or leaf plate 24 may be customized to the plate configuration. In yet other embodiments, any suitable combination of the above configurations, or any other suitable configuration, may be used in switch 100.

In some embodiments, spine 30 comprises a substrate 31, such as an IC substrate or any other suitable printed circuit board (PCB). In an embodiment, one or more ICs, such as a switching IC 50, are mounted on substrate 31. In an embodiment, circuit traces 48 are patterned in substrate 31, and are configured to conduct electrical signals between IC 50 and connectors 36. In some embodiments, spine 30 is inserted into a slot 202 (shown in FIG. 2) of spine plate 22 and is connected thereto by connectors 36, 36A, 36C and 36K mounted on the rear edge of spine 30.

In some embodiments, director-class switch 100 is configured to operate at a rate on the order of GigaBits per second (GBPS) and TeraBits per second (TBPS). The data traversing switch 100 is processed by multiple leaves 32 and spines 30 of switch 100, in parallel, so as to increase the overall rate. In the example of FIG. 4, spine 30 may route electrical signals from IC 60A mounted on leaf 32A to IC 62B mounted on leaf 32B.

In some embodiments, the signals are transmitted from IC 60A via a route comprising traces 49, connectors 46A and 46B, and further transmitted, via cable 26A, connectors 36B and 36A and traces 48, into switching IC 50 mounted on spine 30. Then, switching IC 50 transmits the signals to IC 62B via a route comprising traces 48, connectors 36K and 36H, a cable 26B, connectors 46N and 46M, and traces 49.

The switching configurations described above are simplified and depicted purely by way of example. In alternative embodiments, other suitable configurations, as well as other suitable switching and routing techniques can also be used in implementing switch 100 and midplane 20.

As noted above, the inventors have found that the signal loss may be reduced significantly by minimizing the length of the traces and by applying a uniform length of all traces patterned in the spines and leaves. In the example of FIG. 4, the graded shape of spine 30 and the position of IC 50 mounted thereon, results in a minimal, and optionally uniform, length among all traces 48, whereas cable 26A is longer than cable 26B. This technique reduces the rate of signal-loss events in spine 30, because the cable length has a negligible impact on signal loss.

In an embodiment, IC 50 is mounted on spine 30 so that a center of IC 50 is located at a given distance from each connector among connectors 36, 36C, and 36K. Based on the configuration of spine 30, IC 50 is mounted on spine 30 so that a sum of the given distances between the center of IC 50 and the respective connectors is minimal among all possible positions of IC 50 on spine 30. An exemplary configuration of this technique in depicted in detail in FIG. 5 below.

Figure 5:
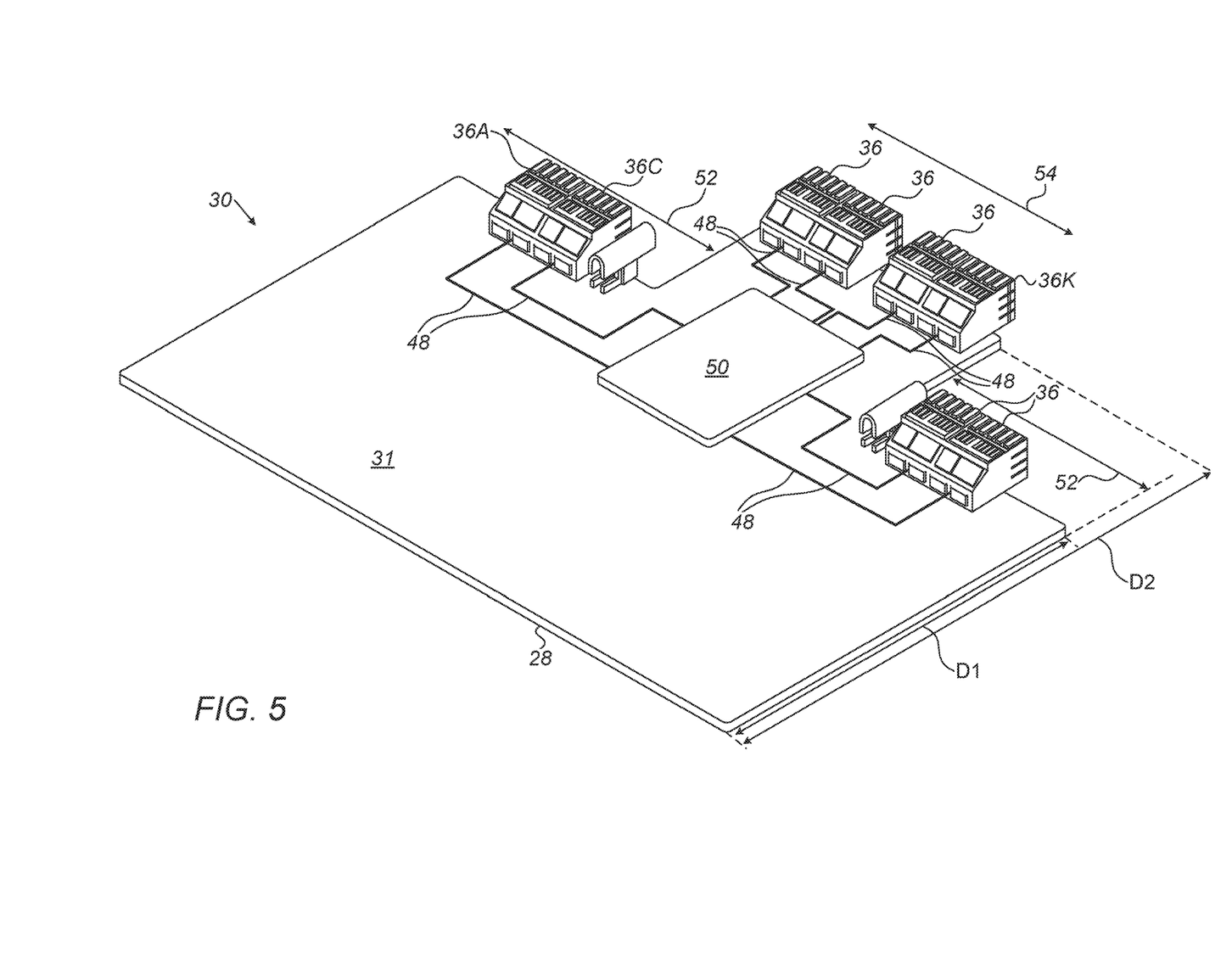
FIG. 5 is a schematic, pictorial illustration of a spine of a director-class switch, in accordance with an embodiment of the present invention.

FIG. 5 is a schematic, pictorial illustration of spine 30, in accordance with an embodiment of the present invention. In some embodiments, spine 30 comprises multiple connectors, such as connectors 36, 36A and 36K, used for connecting multiple input/output (I/O) connections.

As can be seen in the figure, the rear edge of spine 30 has a graded shape that matches the shape of spine plate 22. In some embodiments, connectors 36, 36A, 36C and 36K are mounted along sections 52 and 54, which are located at the rear edge of the graded-shaped substrate 31. In the example of FIG. 5, the rear edge is graded in the sense that sections 52 and 54 are located at different distances from front edge 28. In FIG. 5, each of sections 52 is located at a distance D1 from edge 28, and section 54 is located at a distance D2 from edge 28, wherein D2 is longer than D1.

In some embodiments, traces 48, which are typically made from copper or any other suitable material, are patterned on substrate 31, and are configured to conduct electrical signals between I/O interfaces of IC 50 and connectors 36, 36A, 36C and 36K. In an embodiment, switching IC 50 is mounted on substrate 31 so that the input/output (I/O) interfaces of IC 50 are located at an equidistance from each respective connector among connectors 36, 36A, 36C and 36K. The equidistance refers to the lengths of the relevant traces that each typically comprises one or more straight-line lags.

In this embodiment, all traces 48 connecting between IC 50 and the respective connectors have a minimized length, which is optionally uniform, so as to reduce the rate of signal-loss events in spine 30.

In other embodiments, the same techniques may be applied to one or more leaves 32 (e.g., a graded-shaped edge having multiple sections, similar to sections 52 and 54 having connectors 46 mounted thereon, thus forming a minimal, and optionally uniform, length among traces 49, so as to improve the operational performance of each leaf 32.

During operation, IC 50 typically produces heat. In some embodiments, one or more heat pipes (not shown) may be mounted on spine 30, in close proximity to or physically attached to IC 50. The heat pipes are configured to transfer (e.g., by conduction or convection) the produced heat away from IC 50, e.g., to a heat sink (not shown).

The examples of FIGS. 1-5 refer to a specific switch configuration. This configuration, however, is chosen purely for the sake of conceptual clarity. In other embodiments, the spine switch and spine plate may each comprise any suitable number of sections. Moreover, the sections of the spine switch and spine plate may be located at different respective distances from a common plane, such as the front edge of the spine switch. In alternative embodiments, the disclosed techniques can be used, mutatis mutandis, in various other types of electronic systems, such as various types of switches. For example, spine 30 may comprise three or more sections, e.g., at least one section in addition to sections 52 and 54 depicted in FIG. 5, and two or more switching ICs 50. In this embodiment, the shape of the rear end of spine 30, as well as the pattern of traces 48, and possibly the number of connectors may be chosen for optimal operational performance (e.g., signal-loss rate) of spine 30.

Moreover, the use of the graded shapes described herein is not limited to spine switches or to switches in general, and can be used in any other suitable electronic module. In the present context, spine 30 is regarded as an example of an electronic module, which has a graded edge in order to reduce the lengths of circuit traces.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic module, comprising:
a circuit board having front and rear edges, wherein the rear edge comprises (i) a first section at a first distance from the front edge and (ii) a second section at a second distance from the front edge, larger than the first distance;
first and second connectors, which are mounted along the rear edge at the first and second sections, respectively, and are configured to connect the circuit board to an interconnect unit by connecting, respectively, to first and second different connectors of the interconnect unit; and
an Integrated Circuit (IC) mounted on the circuit board, and comprises circuit traces that connect the IC to the first and second connectors, such that at least a portion of the IC is located at a third distance from the front edge, larger than the first distance.

2. The electronic module according to claim 1, wherein the IC is equidistant from the first and second connectors.

3. The electronic module according to claim 1, wherein the rear edge comprises a third section located at the second distance from the front edge.

4. The electronic module according to claim 1, wherein the front edge comprises a flat section.

5. An electronic rack, comprising:
a first interconnect unit; and
a second interconnect unit shaped as a graded planar plate, comprising:
a first section at a first distance from the first interconnect unit and a second section at a second distance from the first interconnect unit, larger than the first distance, wherein the first and second sections are located on the graded planar plate; and
first and second connectors, which are mounted along the second interconnect unit at the first and second sections, respectively, and are configured to connect the second interconnect unit to one or more electronic modules inserted into the second interconnect unit.

6. The electronic rack according to claim 5, wherein the first interconnect unit is flat.

7. The electronic rack according to claim 5, wherein the first interconnect unit comprises multiple third connectors, which are configured to connect the first interconnect unit to the second interconnect unit.

8. The electronic rack according to claim 7, wherein at least one of the first and second connectors comprises a first sub-connector, which is configured to connect between the second interconnect unit and the electronic module, and a second sub-connector, which is configured to connect between the second interconnect unit and the third connector.

9. The electronic rack according to claim 8, and comprising a cable, which is configured to connect between the second sub-connector and the third connector.

10. A method for producing an electronic module, the method comprising:
providing a circuit board having front and rear edges, wherein the rear edge comprises (i) a first section at a first distance from the front edge and (ii) a second section at a second distance from the front edge, larger than the first distance;
attaching to the circuit board first and second connectors along the rear edge at the first and second sections, respectively, wherein the first and second connectors connect the circuit board to an interconnect unit by connecting, respectively, to first and second different connectors of the interconnect unit; and
mounting on the circuit board an Integrated Circuit (IC), and forming circuit traces that connect the IC to the first and second connectors, such that at least a portion of the IC is located at a third distance from the front edge, larger than the first distance.

11. An electronic module, comprising:
a circuit board having front and rear edges, wherein the rear edge comprises (i) a first section at a first distance from the front edge and (ii) a second section at a second distance from the front edge, larger than the first distance;
first and second connectors, which are mounted along the rear edge of the circuit board at the first and second sections, respectively, and are configured to connect the circuit board to an interconnect unit, by connecting, respectively, to first and second different connectors of the interconnect unit; and
an integrated circuit (IC), which is mounted on the circuit board, such that at least a portion of the IC is located at a third distance from the front edge, larger than the first distance, and whose center is positioned at a first distance from the first connector and at a second distance from the second connector, such that a sum of the first and second distances is minimal among all possible positions of the IC on the circuit board.

12. The electronic module according to claim 11, wherein the circuit board comprises circuit traces that connect the IC to the first and second connectors.

13. The electronic module according to claim 11, wherein the IC is equidistant from the first and second connectors.

14. The electronic module according to claim 11, wherein the rear edge comprises a third section located at the second distance from the front edge.

15. The electronic module according to claim 11, wherein the front edge comprises a flat section.

\* \* \* \* \*